(12) United States Patent
Koc et al.

(10) Patent No.: US 7,915,788 B2
(45) Date of Patent: Mar. 29, 2011

(54) PIEZOELECTRIC VIBRATOR, MANUFACTURING METHOD THEREOF AND LINEAR ACTUATOR HAVING THE SAME

(75) Inventors: Burhanettin Koc, Kyungki-do (KR); Dong Kyun Lee, Seoul (KR); Byung Woo Kang, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 260 days.

(21) Appl. No.: 11/514,950

(22) Filed: Sep. 5, 2006

(65) Prior Publication Data

US 2007/0052329 A1    Mar. 8, 2007

(30) Foreign Application Priority Data

Sep. 5, 2005  (KR) .................. 10-2005-0082203

(51) Int. Cl.
*H01L 41/047* (2006.01)
*H02N 2/04* (2006.01)
(52) U.S. Cl. .............. 310/323.19; 310/323.01; 310/365; 310/366
(58) Field of Classification Search .......... 310/328, 310/365, 366, 323.01–323.21
See application file for complete search history.

(56) References Cited

U.S. PATENT DOCUMENTS

| 6,396,194 | B1 | 5/2002 | Iino et al. | |
|---|---|---|---|---|
| 7,265,480 | B2 * | 9/2007 | Sasaki | 310/323.01 |
| 7,323,807 | B2 * | 1/2008 | Sasaki | 310/366 |
| 2004/0189155 | A1 * | 9/2004 | Funakubo | 310/366 |
| 2005/0082947 | A1 | 4/2005 | Li et al. | |
| 2006/0061241 | A1 * | 3/2006 | Sasaki | 310/366 |

FOREIGN PATENT DOCUMENTS

| JP | 8-237971 | 9/1996 |
|---|---|---|
| JP | 08-242025 | 9/1996 |
| JP | 11-127585 | 5/1999 |
| JP | 2000-116162 | 4/2000 |
| JP | 2000-308376 | 11/2000 |
| JP | 2001-284667 | 10/2001 |
| JP | 2005-006495 | 1/2005 |
| JP | 2005-12192 | 1/2005 |
| JP | 2005-151756 | 6/2005 |
| WO | 00/74153 | 12/2000 |
| WO | 2004/012279 | 2/2004 |

OTHER PUBLICATIONS

Japanese Office Action issued on Jun. 23, 2009 in corresponding Japanese Patent Application 2006-239823.
Japanese Office Action dated Feb. 16, 2010, issued in corresponding Japanese Application No. 2006-239823.
German Office Action dated Sep. 1, 2010, issued in corresponding German Application No. 10 2006 040 751.2.

* cited by examiner

*Primary Examiner* — Derek J Rosenau

(57) ABSTRACT

The piezoelectric vibrator includes the piezoelectric bar having a plurality of piezoelectric plates alternately stacked and a plurality of vibration sectors divided vertically and horizontally with respect to the direction in which the piezoelectric plates are stacked. Electrode terminals are formed on each of surface regions of the piezoelectric plate, divided in a longitudinal direction thereof, and jump terminals corresponding to electrode terminals are formed on a surface of an adjacent one of the piezoelectric plates. On side surfaces of the piezoelectric plates, a plurality of side electrodes are formed, connecting the electrode terminals and the corresponding jump terminals to power the vibration sectors, by which a pair of the vibration sectors diagonally disposed from each other are simultaneously powered. The piezoelectric vibrator is small and easily manufactured and mass-produced with a simple structure.

9 Claims, 20 Drawing Sheets

100

100

PIEZOELECTRIC VIBRATOR, MANUFACTURING METHOD THEREOF AND LINEAR ACTUATOR HAVING THE SAME

CLAIM OF PRIORITY

This application claims the benefit of Korean Patent Application No. 2005-82203 filed on Sep. 5, 2005, in the Korean Intellectual Property Office, the disclosure of which is incorporated herein by reference.

BACKGROUND OF THE INVENTION

1. Field of the Invention

The present invention relates to a piezoelectric vibrator, and more particularly, to a piezoelectric vibrator which makes an elliptical motion by combination of vibrations in a longitudinal mode and a flexural mode.

2. Description of the Related Art

Recently, ultrasonic motors using piezoelectric vibrators are drawing attention as new kinds of motors replacing electromagnetic motors. The ultrasonic motors using the piezoelectric vibrators have various advantages such as high resolution of displacement, silent operation due to absent of gear mechanisms, and low electromagnetic noise generation.

FIG. 1 is a schematic view illustrating a structure of a conventional piezoelectric vibrator 10.

As shown in FIG. 1, the piezoelectric vibrator 10 is divided into four vibration sectors 11, 12, 13 and 14, and has external electrodes 21 and 22 made of wires for applying alternating voltages of the same phase to two of the vibration sectors 11 and 14, 12 and 13 disposed diagonally from each other.

In addition, the piezoelectric vibrator 10 has a protrusion 30 at a side thereof for transferring driving power to the outside.

However, it is difficult to miniaturize such a conventional piezoelectric vibrator 10 having the external electrodes 21 and 22, requiring a space for installing the wires, thus complicating the manufacturing processes and obstructing mass production.

Therefore, there has been a need for a piezoelectric vibrator with a simple structure, which is suitable for miniaturization while facilitating manufacturing processes.

SUMMARY OF THE INVENTION

The present invention has been made to solve the foregoing problems of the prior art and therefore an object of certain embodiments of the present invention is to provide a piezoelectric vibrator which has a small size, and is easily manufactured and mass-produced, and a manufacturing method thereof.

Another object of certain embodiments of the invention is to provide a piezoelectric vibrator having a structure in which vibration sectors disposed diagonally from each other are simply and easily connected, and a manufacturing method thereof.

Further another object of certain embodiments of the invention is to provide a linear actuator capable of linear movement using such a piezoelectric vibrator.

According to an aspect of the invention for realizing the object, there is provided a piezoelectric vibrator including: a piezoelectric bar including a plurality of piezoelectric plates alternately stacked, the piezoelectric bar having a plurality of vibration sectors divided vertically and horizontally with respect to the direction in which the piezoelectric plates are stacked; an internal electrode pattern formed on upper surfaces of the piezoelectric plates, the internal electrode pattern on each of the piezoelectric plates including electrode terminals each disposed on each of surface regions of the piezoelectric plate, divided in a longitudinal direction thereof, the electrode terminal having an end extended to an outer periphery of the piezoelectric plate, and jump terminals corresponding to electrode terminals formed on a surface of an adjacent one of the piezoelectric plates; an external electrode pattern formed on side surfaces of the piezoelectric plates, the external electrode pattern including a plurality of side electrodes connecting the electrode terminals and the corresponding jump terminals to power the vibration sectors, whereby a pair of the vibration sectors diagonally disposed from each other are simultaneously powered; and a power transmission member formed at a side of the piezoelectric bar to transmit the vibration generated at the vibration sectors to the outside.

Preferably, the piezoelectric bar comprises first and second piezoelectric plates alternately stacked, and the internal electrode pattern comprises a first pattern formed on the first piezoelectric plate and a second pattern formed on the second piezoelectric plate adjacent to the first piezoelectric plate.

At this time, the first pattern comprises a first set of the electrode terminals and a first set of the jump terminals, which are disposed on the first piezoelectric plate, and the second pattern comprises a second set of the electrode terminals and a second set of the jump terminals, which are disposed on the second piezoelectric plate.

Preferably, each of the vibration sectors of the piezoelectric bar may have the same number of piezoelectric plates stacked.

Preferably, the piezoelectric bar may have an intermediate layer vertically separating the vibration sectors.

In the meantime, it is preferable that the internal electrode pattern comprises an upper pattern disposed on an upper one of the vibration sectors and a lower pattern disposed on a lower one of the vibration sectors having a shape symmetrical to that of the upper pattern about a plane on which the piezoelectric plates are stacked.

Preferably, the piezoelectric bar comprises four of the vibration sectors, wherein alternating voltages of the same phase are applied to a pair of the vibration sectors disposed diagonally from each other to simultaneously generate a vibration of longitudinal mode and a vibration of flexural mode.

According to another aspect of the invention for realizing the object, there is provided a method of manufacturing a piezoelectric vibrator including steps of:

(a) forming a plurality of internal electrode patterns composed of a plurality of electrode terminals and a plurality of jump terminals on internal electrode surfaces of piezoelectric sheets for forming a plurality of piezoelectric plates;

(b) stacking the piezoelectric sheets with the internal electrode patterns formed thereon to simultaneously form a plurality of piezoelectric bars having a plurality of vibration sectors separated horizontally and vertically with respect to the direction in which the piezoelectric sheets are stacked;

(c) cutting the piezoelectric sheets into the plurality of piezoelectric bars;

(d) forming a plurality of side electrodes on side surfaces of each of the piezoelectric bars; and (e) mounting a power transmission member at a side of each of the piezoelectric bars.

Preferably, the step (a) may including steps of:

(a1) forming first patterns on first sheets of the piezoelectric sheets for forming first plates of the piezoelectric plates, each of the first patterns comprising first electrode terminals each disposed on each of surface regions of each of the first piezoelectric plates divided in a longitudinal direction thereof, the first electrode terminal having an end extended to an outer periphery of the first piezoelectric plate, and first jump terminals formed on the first piezoelectric plate adjacent to an outer periphery thereof;

(a2) forming second patterns on second sheets of the piezoelectric sheets for forming second plates of the piezoelectric sheets, each of the second patterns comprising second electrode terminals each disposed on each of surface regions of each of the second piezoelectric plates divided in a longitudinal direction thereof, the second electrode terminal having an end extended to an outer periphery of the second piezoelectric plate corresponding to each of the first jump terminals, and second jump terminals formed on the second piezoelectric plate adjacent to an outer periphery thereof, each of the second jump terminals corresponding to each of the first electrode terminals, and the step (b) comprises stacking the first piezoelectric sheets and the second piezoelectric sheets alternately.

Preferably, the step (b) may include stacking the same number of piezoelectric sheets to form the plurality of vibration sectors.

Preferably, the step (b) includes stacking a sheet as an intermediate layer to separate to the vibration sectors stacked vertically.

Preferably, the step (d) may include connecting the electrode terminals and the corresponding jump terminals to power the vibration sectors, whereby a pair of the vibration sectors diagonally disposed from each other is simultaneously powered.

Preferably, the step (a) may include forming the internal electrode patterns such that the internal electrode pattern of an upper vibration sector of the piezoelectric bar has a shape symmetrical to that of the internal electrode pattern of a lower vibration sector of the piezoelectric bar about the plane on which the piezoelectric plates are stacked.

According to further another aspect of the invention for realizing the object, there is provided a linear actuator including: the aforedescribed piezoelectric vibrator; and a slider disposed linearly movable, in contact with a power transmission member of the piezoelectric vibrator.

Preferably, the linear actuator may further include a preload member which presses the piezoelectric vibrator against the slider.

BRIEF DESCRIPTION OF THE DRAWINGS

The above and other objects, features and other advantages of the present invention will be more clearly understood from the following detailed description taken in conjunction with the accompanying drawings, in which:

FIGS. 5a to 5c illustrate vibration modes of the piezoelectric vibrator according to the present invention, in which FIG. 5a is a synthetic mode, FIG. 5b is a longitudinal mode and FIG. 5c is a flexural mode;

FIGS. 6a to 6c illustrate other modes of the piezoelectric vibrator according to the present invention, in which FIG. 6a is a synthetic mode, FIG. 6b is a longitudinal mode and FIG. 6c is a flexural mode;

DETAILED DESCRIPTION OF THE PREFERRED EMBODIMENT

Preferred embodiments of the present invention will now be described in detail with reference to the accompanying drawings.

Figure 1:
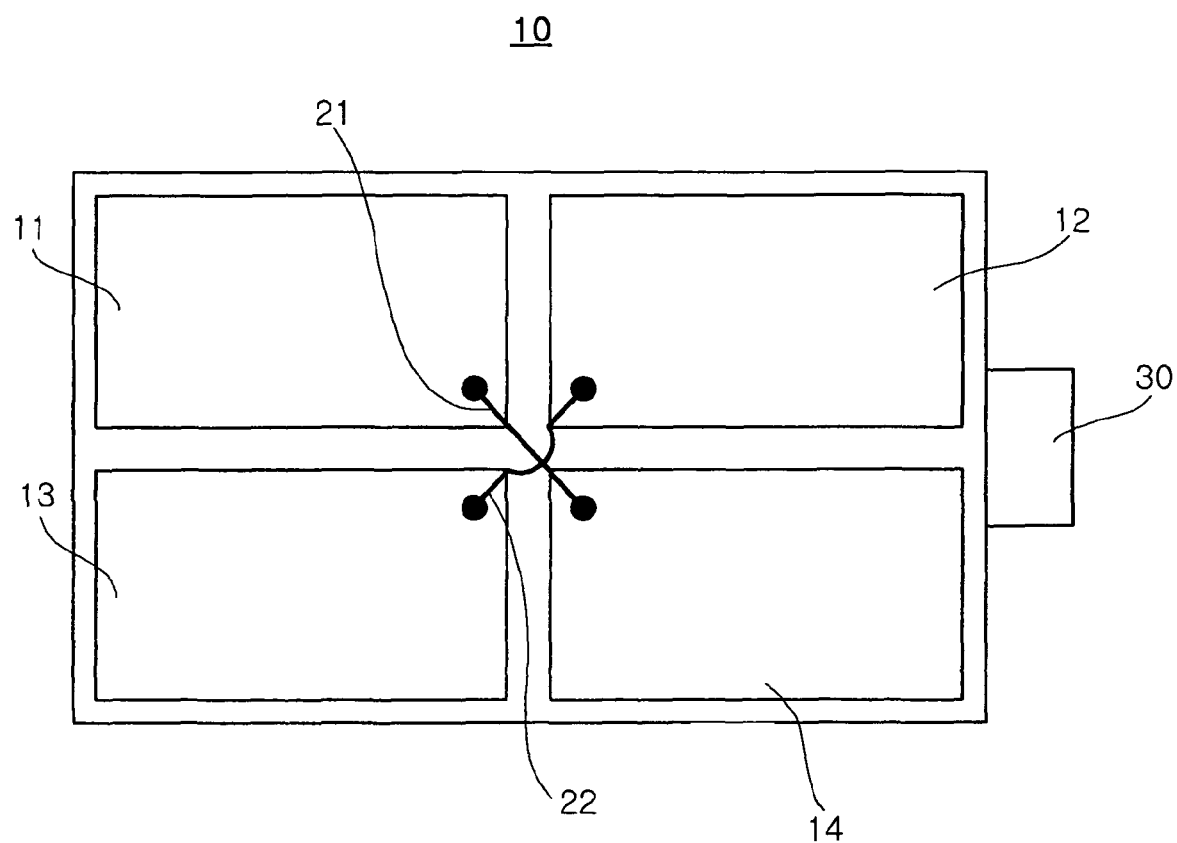
FIG. 1 is a schematic view illustrating a structure of a conventional piezoelectric vibrator.
Figure 2:
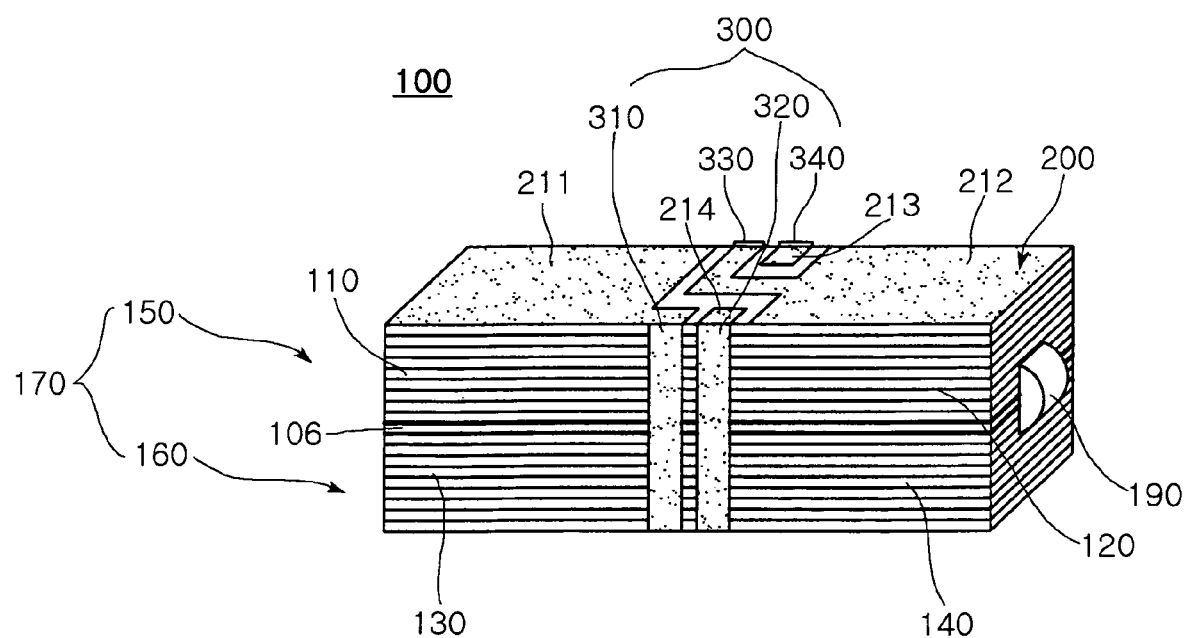
FIG. 2 is a perspective view illustrating a piezoelectric vibrator according to the present invention.
Figure 3:
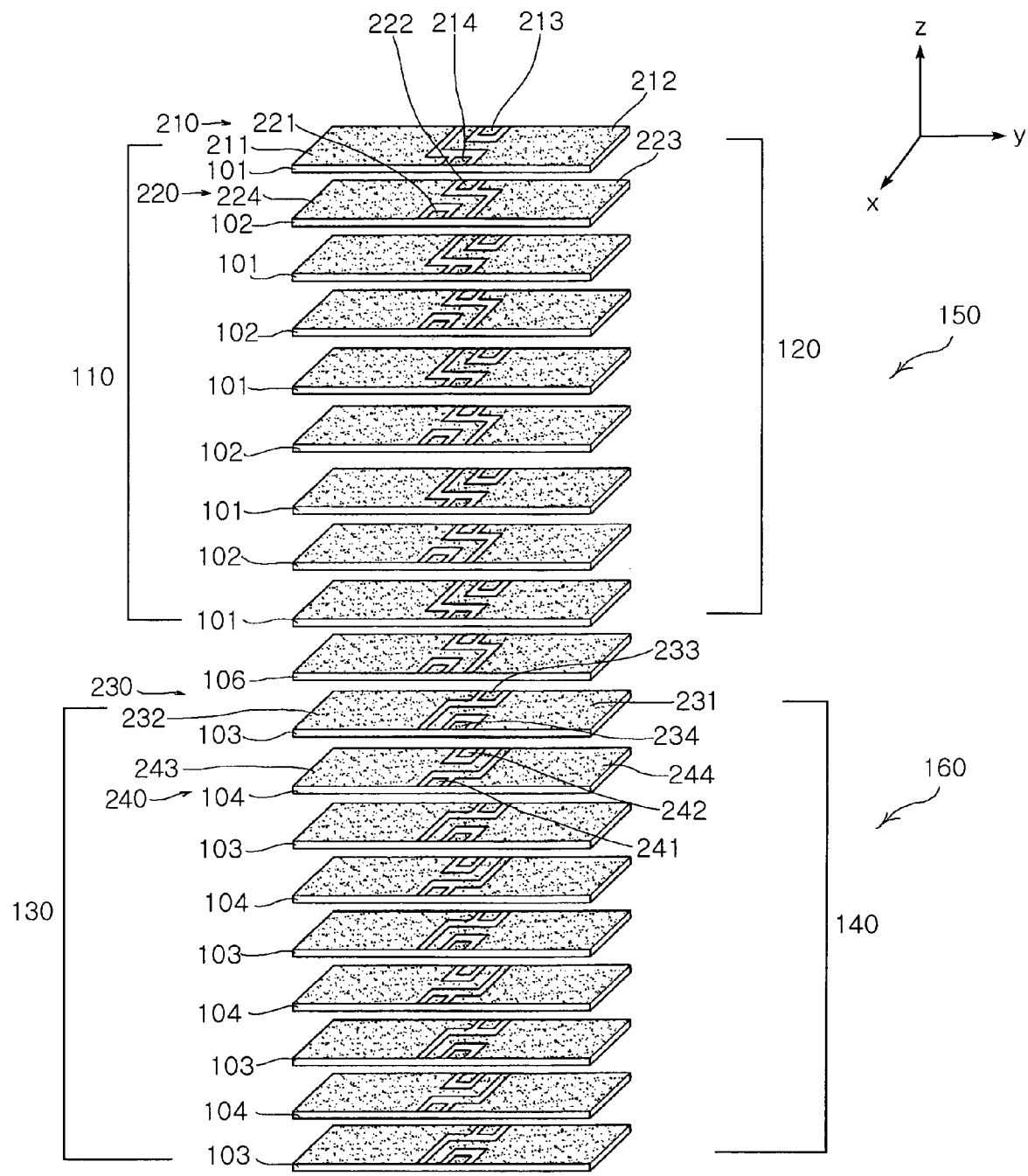
FIG. 3 is a perspective view illustrating a major part of the piezoelectric vibrator according to the present invention.
Figure 4:
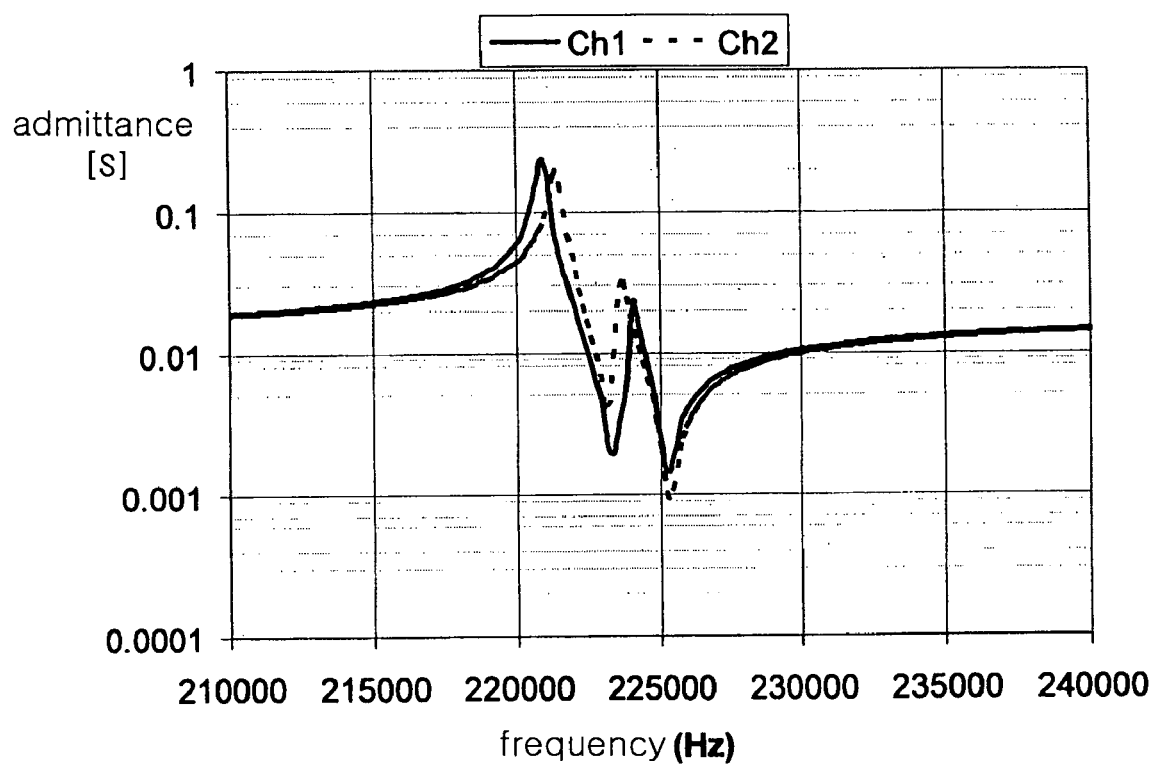
FIG. 4 is a graph illustrating admittances plotted against the frequency of the piezoelectric vibrator according to the present invention.

FIG. 2 is a perspective view illustrating a piezoelectric vibrator according to the present invention, FIG. 3 is an exploded perspective view illustrating a major part of the piezoelectric vibrator according to the present invention, and FIG. 4 is a graph illustrating the admittances plotted against the frequency of the piezoelectric vibrator according to the present invention.

Figure 5A:
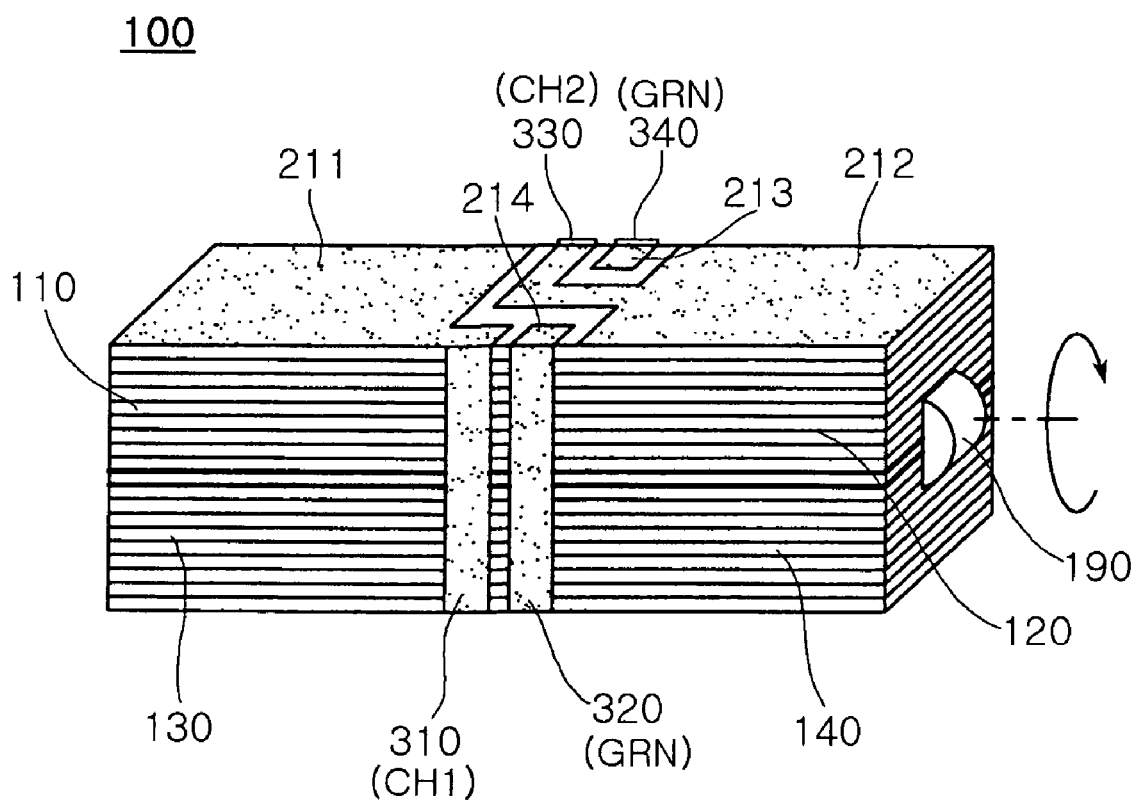
Figure 5B:
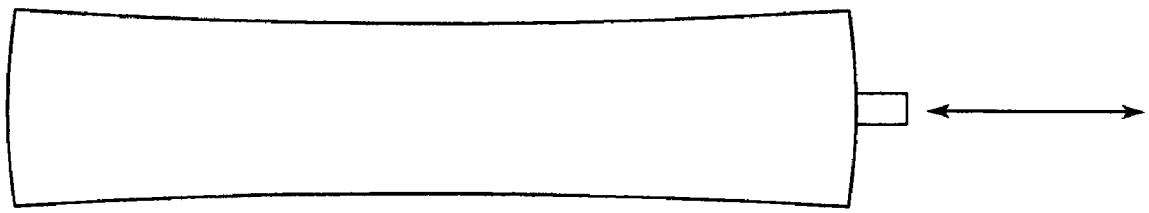
Figure 5C:
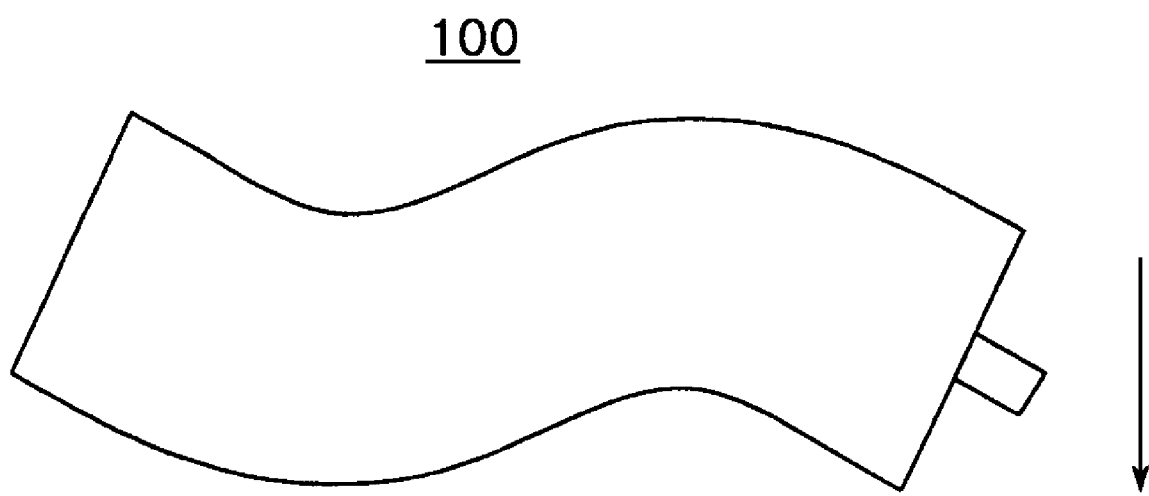
Figure 6A:
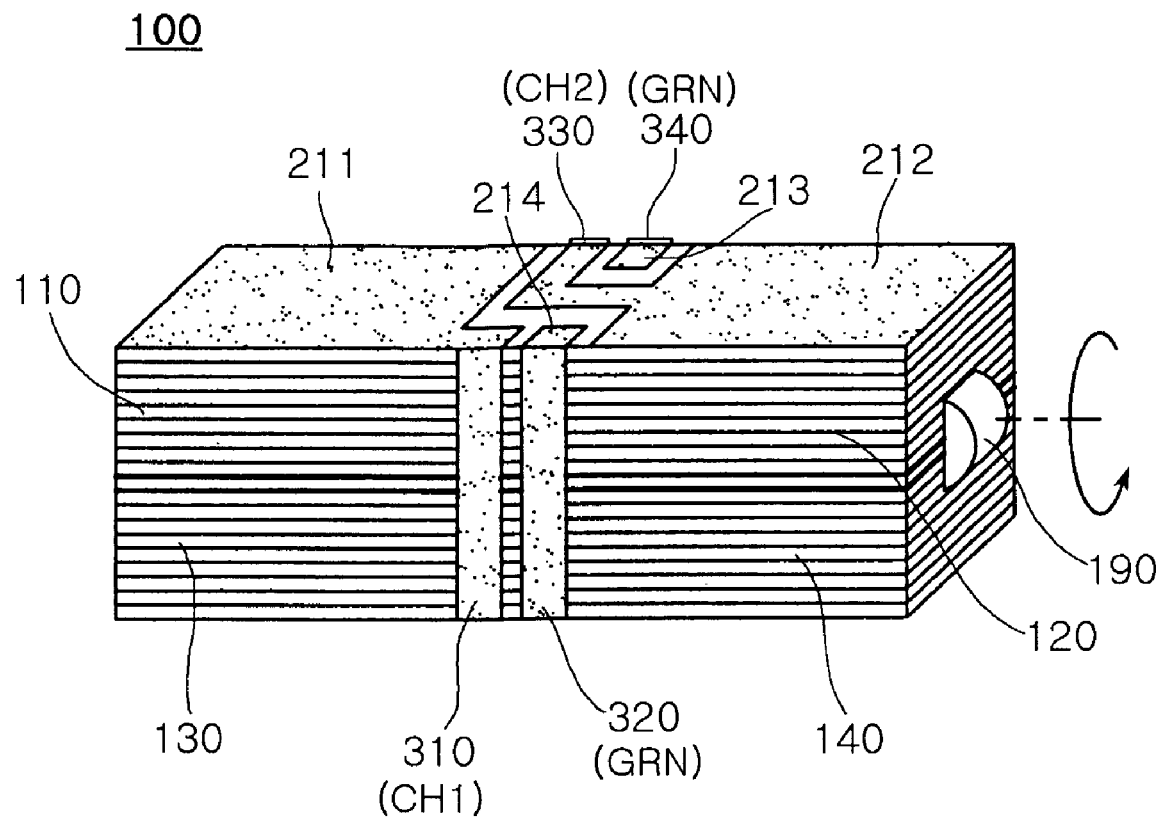
Figure 6B:
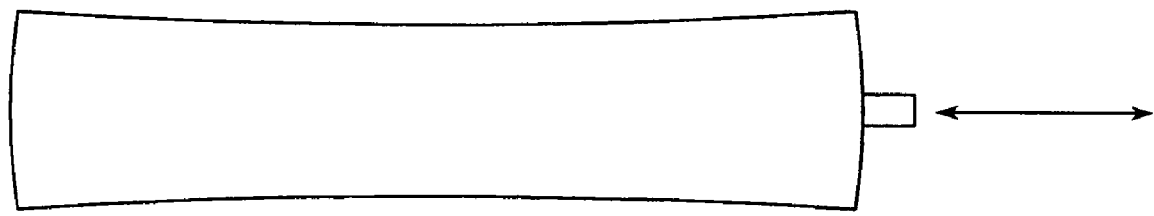
Figure 6C:
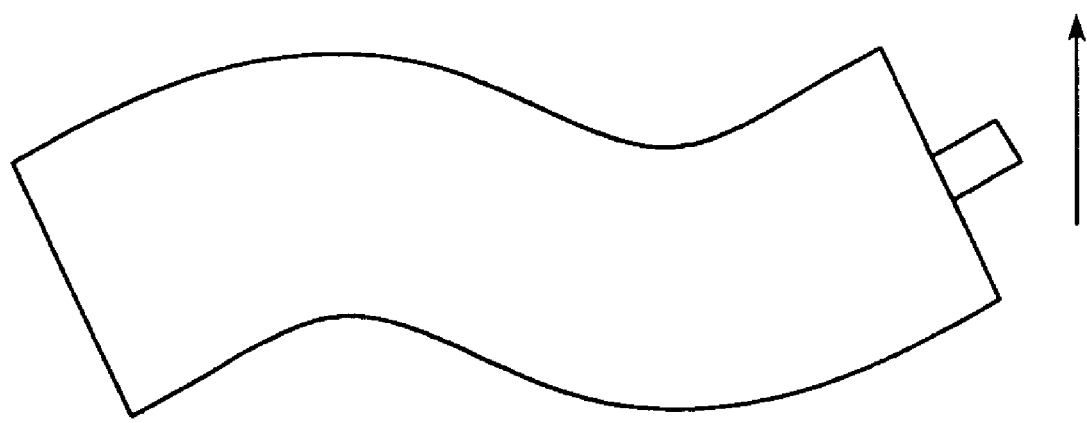

FIG. 5a to 5c illustrate vibration modes of the piezoelectric vibrator according to the present invention, in which FIG. 5a is a synthetic mode, FIG. 5b is a longitudinal mode and FIG. 5c is a flexural mode. FIGS. 6a to 6c illustrate other modes of the piezoelectric vibrator according to the present invention, in which FIG. 6a is a synthetic mode, FIG. 6b is a longitudinal mode and FIG. 6c is a flexural mode.

As shown in FIG. 2, the piezoelectric vibrator 100 according to the present invention includes a piezoelectric bar 170 having a plurality of vibration sectors 110, 120, 130 and 140, an internal electrode pattern 200, an external electrode pattern 300 and a power transmission member 190.

As shown in FIGS. 2 and 3, the piezoelectric bar 170 includes a first stack 150 formed with a plurality of piezoelectric plates 101 and 102 alternately stacked, and a second stack 160 formed by another set of plurality of piezoelectric plates 103 and 104 alternately stacked.

The first stack 150 is disposed on the second stack 160, and has two vibration sectors 110 and 120 divided in a longitudinal direction of the piezoelectric bar 170. In addition, the second stack 160 has two vibration sectors 130 and 140 divided in a longitudinal direction of the piezoelectric bar 170.

That is, the piezoelectric bar 170 has a plurality of vibration sectors divided vertically along and horizontally with respect to the direction in which the piezoelectric plates are stacked.

In this specification, this embodiment of the invention is exemplified by a piezoelectric bar 170 having a total of four vibration sectors divided into pairs in longitudinal and thickness directions of the piezoelectric bar 170, but is not limited thereto. For example, the invention may include eight vibration sectors composed of four in a longitudinal direction and two in a thickness direction of the piezoelectric bar 170.

As shown in FIG. 3, the first stack 150 is composed of the first piezoelectric plates 101 and the second piezoelectric plates 102 stacked alternately, and the second stack 160 is composed of the first piezoelectric plates 103 and the second piezoelectric plates 104 stacked alternately.

In addition, as shown in FIG. 3, the internal electrode pattern 200 is formed on each of the piezoelectric plate surfaces of the piezoelectric plates 101, 102, 103 and 104.

Here, the internal electrode pattern 200 may be composed of first patterns 210 and 230 formed respectively on surfaces of the first piezoelectric plates 101 and 103 of the first and second stacks 150 and 160, and second patterns 220 and 240 formed respectively on surfaces of the second piezoelectric plates 102 and 104 adjacent to the first piezoelectric plates 101 and 103 with the first patterns formed thereon.

Here, each of the first patterns 210 and 230 and the second patterns 220 and 240 is composed of two electrode terminals and two jump terminals formed on each of the piezoelectric plates 101, 102, 103 and 104.

For example, the first pattern 210 is disposed on each of two surface regions of an upper surface of the first piezoelectric plate 101 of the first stack 150, divided in a longitudinal direction thereof. The first pattern 210 has two first electrode terminals 211 and 212 extended from a central portion of the first piezoelectric plate 102 to outer peripheries thereof, and two first jump terminals 213 and 214 formed in edges of the central portion of the plate 101, corresponding to second electrode terminals 223 and 224 formed on a surface of the adjacent second piezoelectric plate 102.

In addition, the second pattern 220 is disposed on each of two surface regions of an upper surface of the second piezoelectric plate 102 of the first stack 150, divided in a longitudinal direction thereof. The second pattern 220 has two second electrode terminals 223 and 224 extended from a central portion of the first piezoelectric plate 102 to outer peripheries thereof, and two second jump terminals 221 and 222 formed in edges of the central portion of the plate 102, corresponding to the first electrode terminals 211 and 212 formed on a surface of the adjacent first piezoelectric plate 101.

In addition, the first pattern 230 is disposed on each of two surface regions of an upper surface of the first piezoelectric plate 103 of the second stack 160 divided in a longitudinal direction thereof. The first pattern 230 has two first electrode terminals 231 and 232 extended from a central portion of the first piezoelectric plate 103 to outer peripheries thereof, and two first jump terminals 233 and 234 formed in edges of the central portion of the plate 103, corresponding to second electrode terminals 243 and 244 formed on a surface of the adjacent second piezoelectric plate 104.

In addition, the second pattern 240 is disposed on each of two surface regions of an upper surface of the second piezoelectric plate 104 of the second stack 160 divided in a longitudinal direction thereof. The second pattern 240 has two second electrode terminals 243 and 244 extended from a central portion of the first piezoelectric plate 104 to outer peripheries thereof, and two second jump terminals 241 and 242 formed in edges of the central portion of the plate 104, corresponding to the first electrode terminals 231 and 232 formed on the adjacent first piezoelectric plate 103.

In the meantime, the first and second patterns 210 and 220 disposed on the piezoelectric plates 101 and 102 of the vibration sectors 110 and 120 of the first stack 150 which is the upper part of the piezoelectric bar 170, may have shapes symmetrical to the first and second patterns 230 and 240 disposed on the piezoelectric plates 103 and 104 of the vibration sectors 130 and 140 of the second stack 160, which is the lower part, about the plane on which the piezoelectric plates 101, 102, 103 and 104 are stacked.

That is, the first pattern 230 formed on an upper surface of the first piezoelectric plate 103 of the second stack 160 is symmetrical to the first pattern 210 formed on an upper surface of the first piezoelectric plate 101 of the first stack 150 about the plane (xy plane) on which the plates are stacked. The second pattern 240 formed on an upper surface of the second piezoelectric plate 104 of the second stack 160 is symmetrical to the second pattern 220 formed on an upper surface of the second piezoelectric plate 102 of the first stack 150 about the plane (xy plane) on which the plates are stacked.

In addition, the second pattern 220 formed on an upper surface of the second piezoelectric plate 102 of the first stack 150 has a shape rotated in 180 degrees from the first pattern 210 formed on an upper surface of the first piezoelectric plate 101 of the first stack 150 about the z-axis. The second pattern 240 formed on an upper surface of the second piezoelectric plate 104 of the second stack 160 has a shape rotated in 180 degrees from the first pattern 230 formed on an upper surface of the first piezoelectric plate 103 of the second stack 160 about the z-axis. Therefore, these piezoelectric plates 101, 102, 103 and 104 can be rotated and suitably arranged, thereby advantageously reducing the number of patterns to be formed on the piezoelectric plates 101, 102, 103 and 104 in advance.

As shown in FIGS. 2 and 3, the external electrode pattern 300 is formed on side surfaces of the piezoelectric bar 170 via plating, etc.

The external electrode pattern 300 has four side electrodes 310, 320, 330 and 340 connecting the electrode terminals and the corresponding jump terminals of two pairs of the vibration sectors 110, 120, 130 and 140 diagonally disposed from each other so as to apply alternating voltages to the pairs of the vibration sectors 110 and 140; 120 and 130 among the four vibration sectors 110, 120, 130 and 140.

For example, a first side electrode 310 connects the first electrode terminals 211 and the second jump terminals 221 of the vibration sector 110 of the first stack 150 to apply alternating voltages to the vibration sector 110, and the first electrode terminal 231 and the second jump terminal 241 of the second stack 160 to apply the alternating voltages simultaneously to the vibration sector 140 diagonally disposed from the vibration sector 110, through the first electrode terminal 231 of the second stack 160.

In addition, a second side electrode 320 connects the second electrode terminals 224 and the first jump terminals 214 of the vibration sector 110 of the first stack 150 to apply alternating voltages to the vibration sector 110, and the second electrode terminals 244 and the first jump terminals 234 of the second stack 160 to apply the alternating voltages simultaneously to the vibration sector 140 diagonally disposed from the vibration sector 110, through the first jump terminal 234 of the second stack 160.

In addition, a third side electrode 330 connects the first electrode terminals 212 and the second jump terminals 222 of the vibration sector 120 of the first stack 150 to apply alternating voltages to the vibration sector 120, and the first electrode terminals 232 and the second jump terminals 242 of the second stack 160 to apply the alternating voltages simultaneously to the vibration sector 130 diagonally disposed from the vibration sector 120, through the first electrode terminal 232 of the second stack 160.

Further, a fourth side electrode 340 connects the second electrode terminals 223 and the first jump terminals 213 of the vibration sector 120 of the first stack 150 to apply alternating voltages to the vibration sector 120, and the second electrode terminals 243 and the first jump terminals 233 of the second stack 160 to apply the alternating voltages simultaneously to the vibration sector 130 diagonally disposed from the vibration sector 120, through the first jump terminal 233 of the second stack 160.

That is, the alternating voltages are applied to one of the first side electrode 310 and the second side electrode 320 while the other one is grounded (or can be leaved open) to simultaneously drive the pair of vibration sectors 110 and 140 diagonally disposed from each other.

In addition, the alternating voltages are applied to one of the third side electrode 330 and the fourth side electrode 340 while the other one is grounded (or can be leaved open) to simultaneously drive the pair of vibration sectors 120 and 130 disposed diagonally from each other.

In addition to the above described configuration, as shown in FIG. 2, side electrodes 340 and 320 are grounded and an external power source can be directly connected to the exposed electrode surface (211 and 310) or (212 and 330).

Preferably, each of the vibration sectors 110, 120, 130 and 140 of the piezoelectric bar 170 can be formed with the same number of piezoelectric plates 101, 102, 103 and 104 stacked, thereby allowing each of the vibration sectors 110, 120, 130 and 140 to output the same level of driving power (or torque).

In addition, as shown in FIGS. 2 and 3, the piezoelectric bar 170 may have an intermediate layer 106 which separates the vibration sectors disposed vertically. Layer 106 is an active layer and it has the same thickness with the other layers (101, 102, 103 and 104).

The intermediate layer 106 serves to separate the internal electrode pattern 200 during the operation of the piezoelectric bar 170, and may have the first or second pattern 210 or 220 of the first stack 150 formed thereon.

Preferably, the piezoelectric bar 170 may be formed with the first piezoelectric plates 101 and 103 and the second piezoelectric plates 102 and 104 alternately stacked such that the first piezoelectric plates 101 and 103 and the second piezoelectric plates 102 and 104 have opposite polarizations from each other. This is for applying the alternating voltages to the internal electrode pattern 200 of the stacked piezoelectric plates 101, 102, 103 and 104 to generate uniform and equivalent strain or deformation.

In the meantime, the power transmission member 190 is formed at a side of the piezoelectric bar 170 to transfer the vibration generated at the vibration sectors 110, 120, 130 and 140 to the outside.

Now, with reference to FIGS. 4 to 6, the operation of the piezoelectric vibrator 100 according to the present invention will be examined.

FIG. 4 illustrates the relationships between the frequency and admittance compared in the case where the alternate voltage is applied to the first side electrode 310 of the piezoelectric vibrator 100 shown in FIGS. 2 and 3 (Ch1) while the second side electrode 320 is grounded, and in the case where the alternating voltages are applied to the third side electrode 330 (Ch2) while the fourth side electrode 340 is grounded. In FIG. 4, the vibration of each longitudinal mode has a peak around 222 kHz, and the vibration of each flexural mode has a peak around 224 kHz. (Here, the admittance is measured while the second channel Ch2 is left open in the case where the alternating voltages are applied to the first channel Ch1, and while the first channel Ch1 is left open where the alternating voltages are applied to the second channel Ch2).

Therefore, in case of applying a resonance frequency of about 223 kHz to the first channel Ch1 or the second channel Ch2, the vibrations of longitudinal mode and the flexural mode are simultaneously generated.

As a result, in the case where the alternating voltages are applied to the first channel Ch1 while the second channel Ch2 is left open, longitudinal and flexural deformations are resulted in the piezoelectric vibrator 100 due to the deformations generated from the vibration sectors 110 and 140 as shown in FIGS. 6b to 6c, and thus the piezoelectric vibrator 100 makes the elliptical motion in the direction shown in FIG. 6a.

In addition, in the case where the alternating voltages are applied to the second channel Ch2, while the first channel Ch1 is left open, longitudinal and flexural deformations are resulted in the piezoelectric vibrator 100 due to the deformations generated from the vibration sectors 120 and 130 as shown in FIGS. 5b to 5c, and thus the piezoelectric vibrator 100 makes the elliptical motion in the direction shown in FIG. 5a.

Alternatively, alternating voltages of different phases can be simultaneously applied to the first channel Ch1 and the second channel Ch2 to make all of the four vibration sectors vibrate. At this time, the phase difference between the first channel Ch1 and the second channel Ch2 can be 90 degrees or −90 degrees.

Now, the manufacturing method of the piezoelectric vibrator is examined with reference to FIG. 7.

The piezoelectric vibrator according to the present invention is manufactured through the following steps.

a) Forming an Internal Electrode Pattern on a Piezoelectric Sheet

Figure 7A:
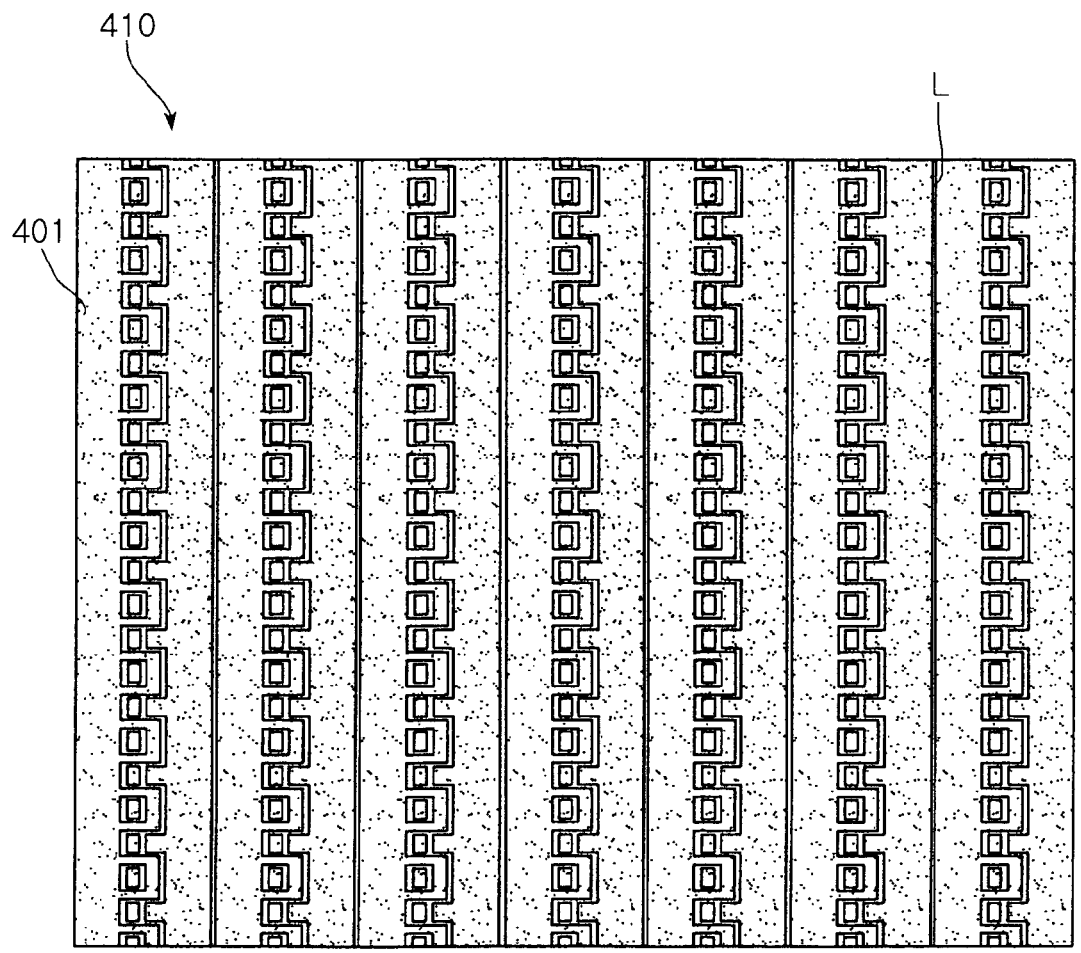
FIG. 7a to 7g are views illustrating a stepwise manufacturing method of the piezoelectric vibrator according to the present invention.

First, as shown in FIGS. 3 and 7a, a plurality of internal electrode patterns 401 each composed of a plurality of electrode terminals and a plurality of jump terminals are formed on a surface of a piezoelectric sheet 410, which is for forming a plurality of piezoelectric plates, as shown in FIG. 3.

The step (a) may include (a1) forming first patterns on a first piezoelectric sheet for forming the first piezoelectric plates 101 and 103 and (a2) forming second patterns 220 and 240 on a second piezoelectric sheet for forming the second piezoelectric plates 102 and 104.

Referring to FIG. 2, through the step (a1), a plurality of first patterns 210 each comprising two first electrode terminals 211 and 212 and two first jump terminals 213 and 214 are formed on a first piezoelectric sheet. The two first electrode terminals 211 and 212 are disposed respectively on surface regions of the first piezoelectric plate 101 divided in a longitudinal direction thereof, each having an end extended to an outer periphery of the first piezoelectric plate 101. The two first jump terminals 213 and 214 are formed in a central portion of the first piezoelectric plate, adjacent to an outer periphery of the first piezoelectric plate 101. The same applies to the first piezoelectric plate 103 of the second stack 160.

In addition, through the step (a2), a plurality of second patterns 220 comprising two electrode terminals 223 and 224 and two jump terminals 221 and 222 are formed on a surface of a second piezoelectric sheet. The two second electrode terminals 223 and 224 are disposed respectively on two surface regions of the second piezoelectric plate 102 in a longitudinal direction thereof, each having an end extended to an outer periphery of the second piezoelectric plate 102, corresponding to the first jump terminal 213 and 214. The two second jump terminals 221 and 222 are formed in a central portion of the second piezoelectric plate 102, adjacent to an outer periphery of the second piezoelectric plate 102 to correspond to the first electrode terminals 211 and 212. The same applies to the second piezoelectric plate 104 of the second stack 160.

At this time, the first and second patterns 210 and 220 of the vibration sectors 110 and 120 of the first stack 150 which is the upper part of the piezoelectric bar 170 may have shapes symmetrical to those of the first and second patterns 230 and 240 of the vibration sectors 130 and 140 of the second stack 160 which is the lower part of the piezoelectric bar 170, about the plane on which the plates 101, 102, 103 and 104 are stacked.

That is, the first pattern 230 formed on an upper surface of the first piezoelectric plate 103 of the second stack 160 is symmetrical to the first pattern 210 formed on an upper surface of the first piezoelectric plate 101 of the first stack 150 about the plane (xy plane) on which the plates are stacked. The second pattern 240 formed on an upper surface of the second piezoelectric plate 104 of the second stack 160 is symmetrical to the second pattern 220 formed on an upper surface of the second piezoelectric plate 102 of the first stack 150 about the plane (xy plane) on which the plates are stacked.

In addition, the second pattern 220 formed on an upper surface of the second piezoelectric plate 102 of the first stack 150 is rotated in 180 degrees from the first pattern 210 formed on an upper surface of the first piezoelectric plate 101 about the z-axis. The second pattern 240 formed on an upper surface of the second piezoelectric plate 104 of the second stack 160 is rotated in 180 degrees from the first pattern 230 formed on an upper surface of the first piezoelectric plate 103 of the second stack 160 about the z-axis. Therefore, the piezoelectric plates 101, 102, 103 and 104 are rotated and suitably arranged to advantageously reduce the number of patterns formed on the piezoelectric plates 101, 102, 103 and 104 in advance.

b) Stacking Piezoelectric Sheets

In this step, the piezoelectric sheets with the first patterns 210 and 220 and the second patterns 230 and 240 formed as described above are stacked.

In order to produce a structure as shown in FIG. 2, a set of the piezoelectric sheets with the first patterns 210 formed thereon and a set of the piezoelectric sheets with the second patterns 220 are alternately stacked to form the first stack 150. Also, another set of piezoelectric sheets with the first patterns 230 formed thereon and another set of piezoelectric sheets with the second patterns 240 are alternately stacked to form the second stack 160 (see FIG. 7b).

Thus, a plurality of piezoelectric bars each having four vibration sectors divided horizontally and vertically with respect to the direction the piezoelectric sheets are stacked are formed simultaneously.

At this time, it is preferable that each of the vibration sectors 110, 120, 130 and 140 constituting the piezoelectric bar 170 are formed with the same number of piezoelectric sheets to output the same level of power (or torque).

Figure 7B:
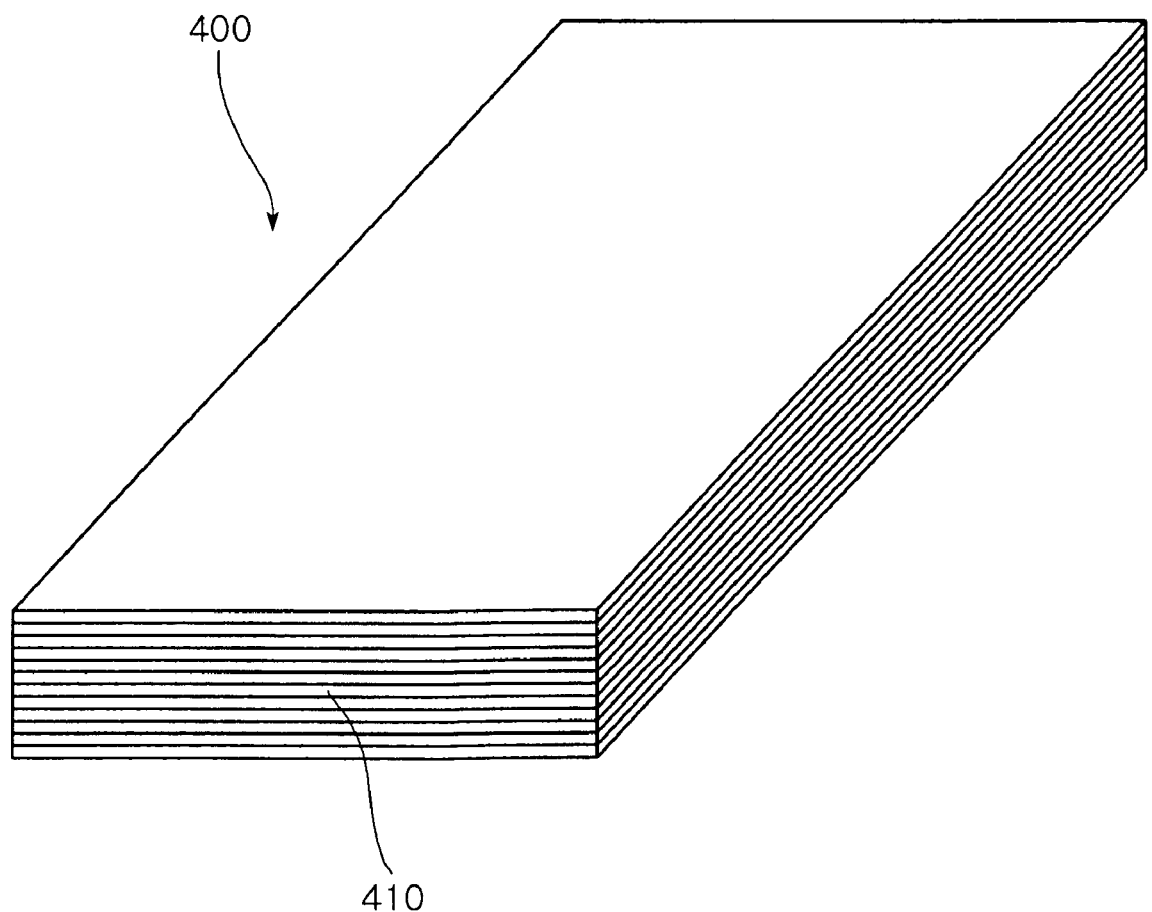

In addition, a piezoelectric sheet assembly shown in FIG. 7b may have a sheet as an intermediate layer 106 stacked additionally to separate the upper vibration sectors 110 and 120 from the lower vibration sectors 130 and 140. Here, the intermediate layer 106 serves to separate the internal electrode pattern 200 during the operation of the piezoelectric bar 170, and may have the first or second pattern 210 and 220 of the first stack 150 formed thereon.

Preferably, the piezoelectric sheet assembly 400 is formed by alternately stacking the piezoelectric sheets for forming the first piezoelectric plates 101 and 103 and the piezoelectric sheets for forming the second piezoelectric plates 102 and 104, which have opposite polarizations. This is for uniform generation of longitudinal and flexural modes of vibrations in each of the piezoelectric plates constituting the vibration sectors by the alternating voltages applied to the internal electrode pattern 200.

c) Cutting the Piezoelectric Sheets into the Plurality of Piezoelectric Bars

Figure 7C:
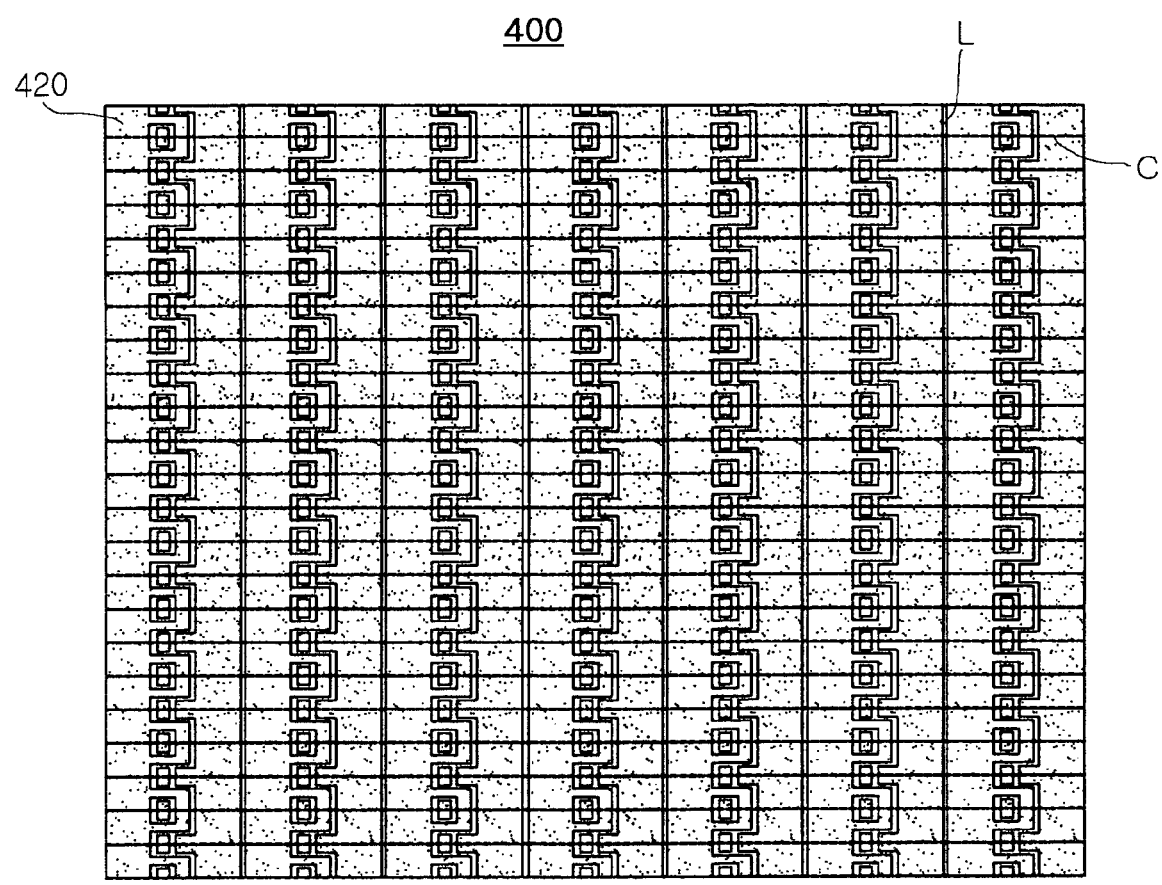

As shown in FIG. 7c, the piezoelectric sheet assembly 400 is cut along the cutting lines L and C to obtain a plurality of piezoelectric bars 420.

Figure 7D:
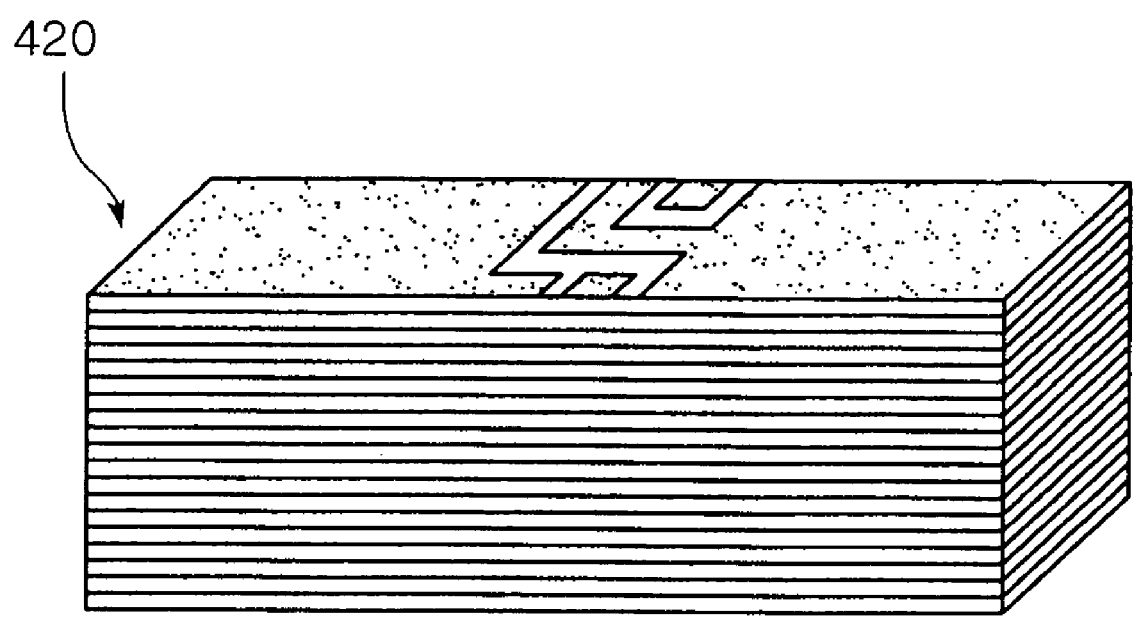
Figure 7E:
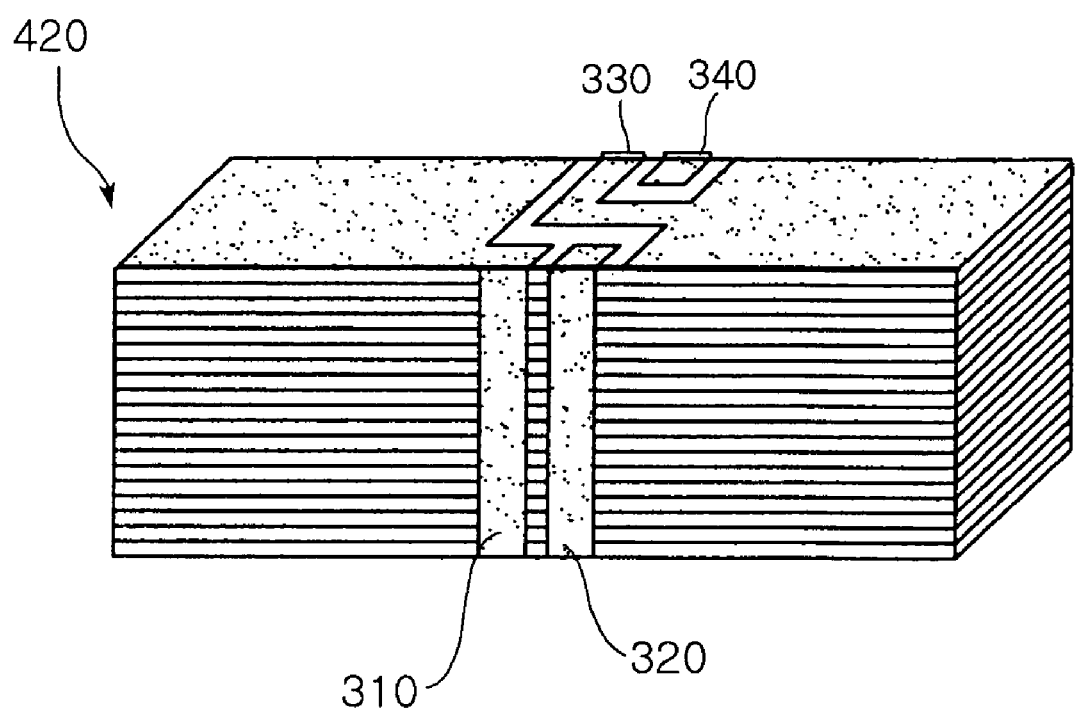

FIG. 7d illustrates the piezoelectric bar 420 obtained after such a procedure.

d) Forming a Plurality of Side Electrodes at Side Surfaces of the Piezoelectric Bar As shown in FIG. 7e, four side electrodes 310, 320, 330 and 340 are formed at the side surface of the piezoelectric bar 420.

Figure 7F:
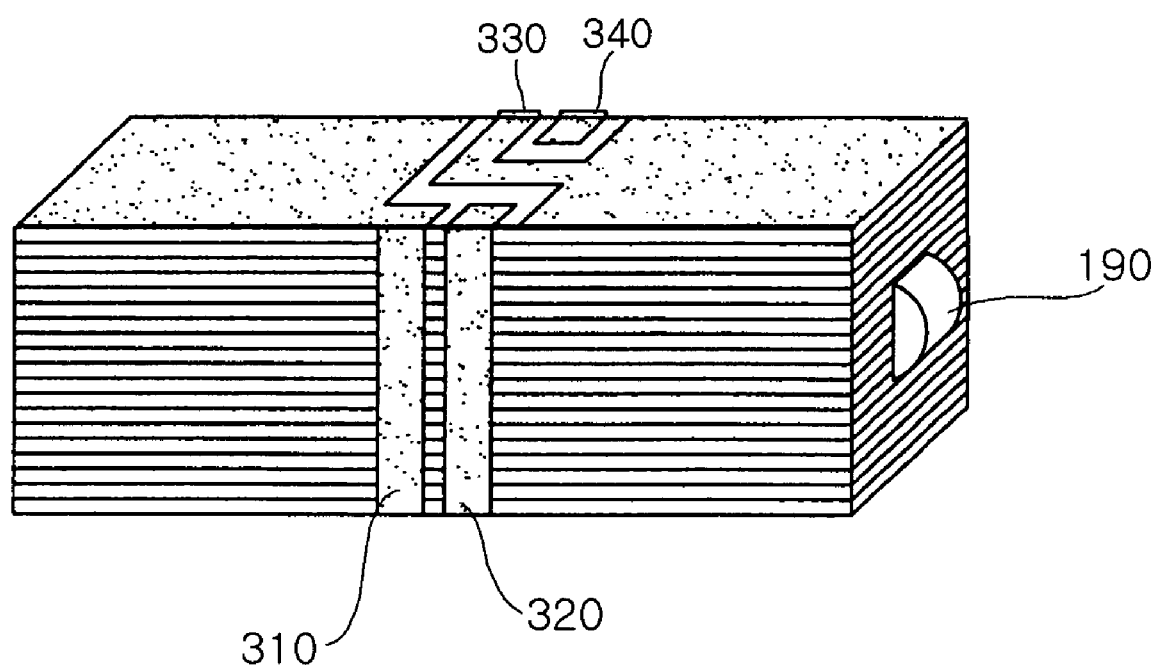

Referring to FIGS. 2 and 3, these side electrodes 310, 320, 330 and 340 connect the electrode terminals and the corresponding jump terminals of the pair of vibration sectors diagonally disposed from each other to simultaneously power the pair of vibration sectors.

e) Mounting a Power Transmission Member to a Side of Each of the Piezoelectric Bars As shown in FIG. 7f, a power transmission member 190 in a shape of a protrusion is mounted at a side of each of the piezoelectric bars 420 to transmit the driving power generated from the piezoelectric bar 420.

As shown in FIG. 7f, such a power transmission member 190 may be formed at a right side of the piezoelectric bar 420 but depending on the resonance characteristics of the vibration sectors, it can be formed at any surface of the piezoelectric bar 420. In addition, as shown in FIG. 7f, there may be one power transmission member 190 mounted but the invention is not limited thereto and may have a plurality of power transmission members 190.

Figure 7G:
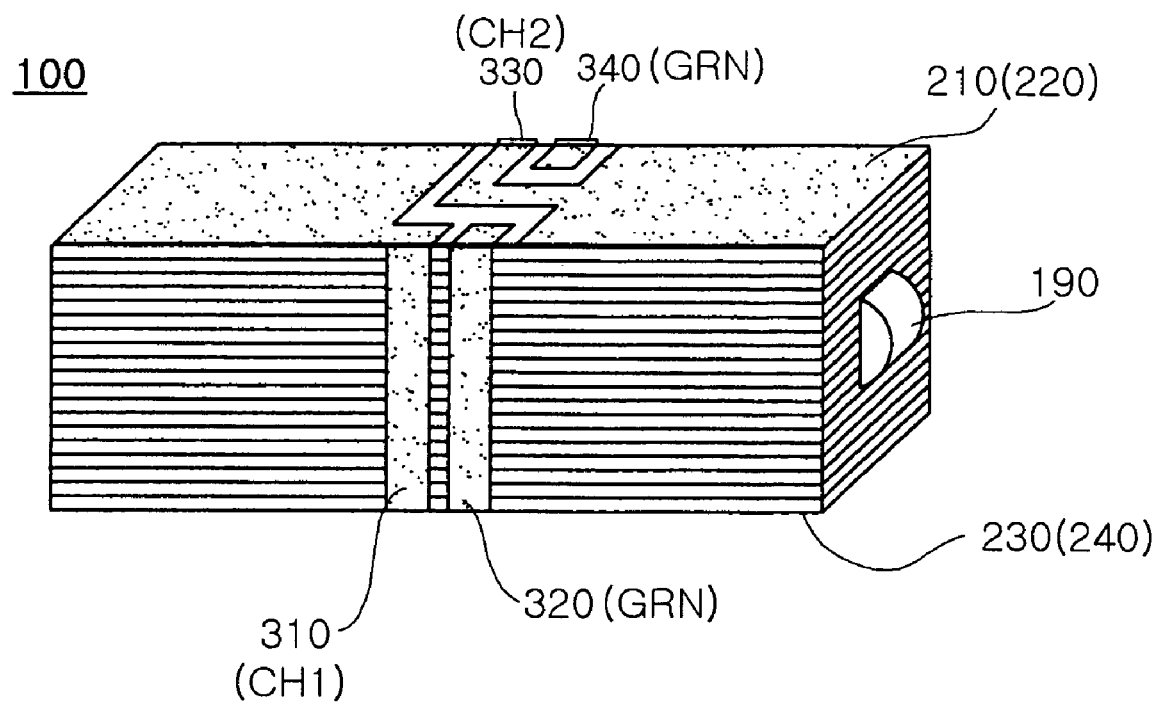
Figure 8:
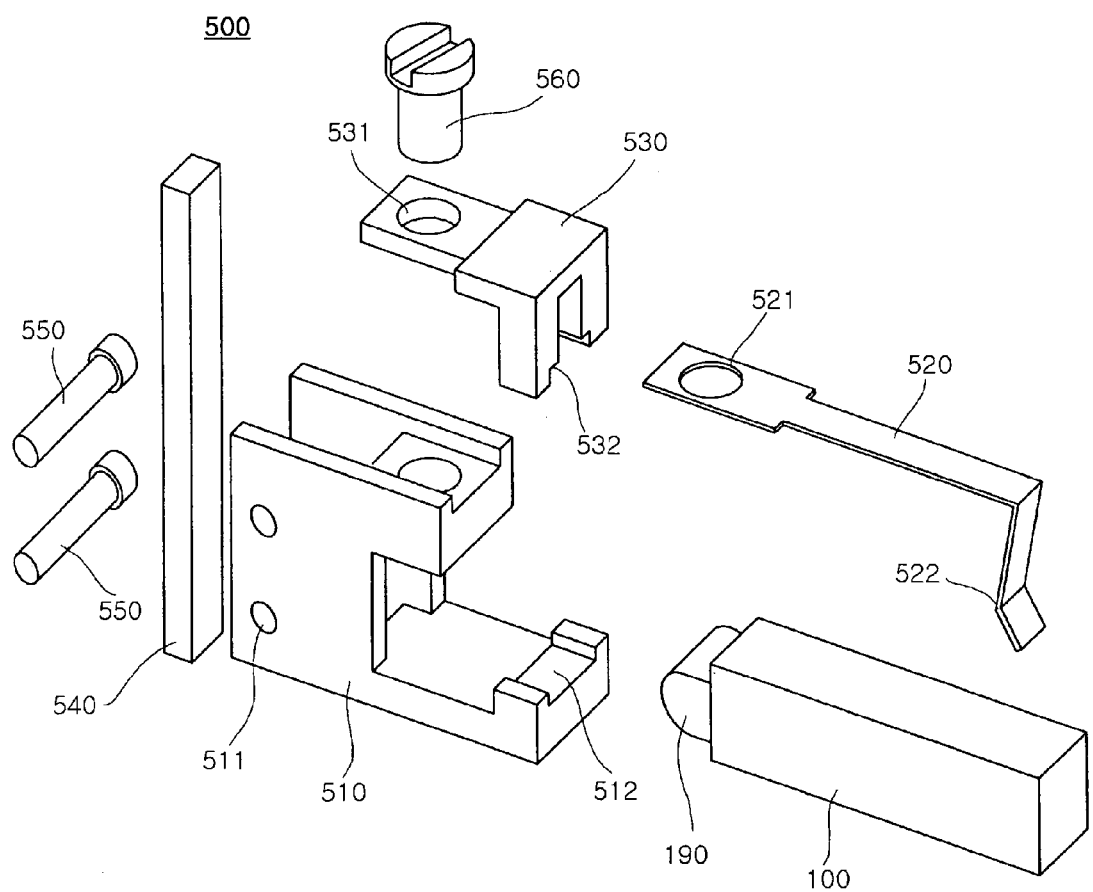
FIG. 8 is an exploded perspective view illustrating a linear actuator according to the present invention.
Figure 9:
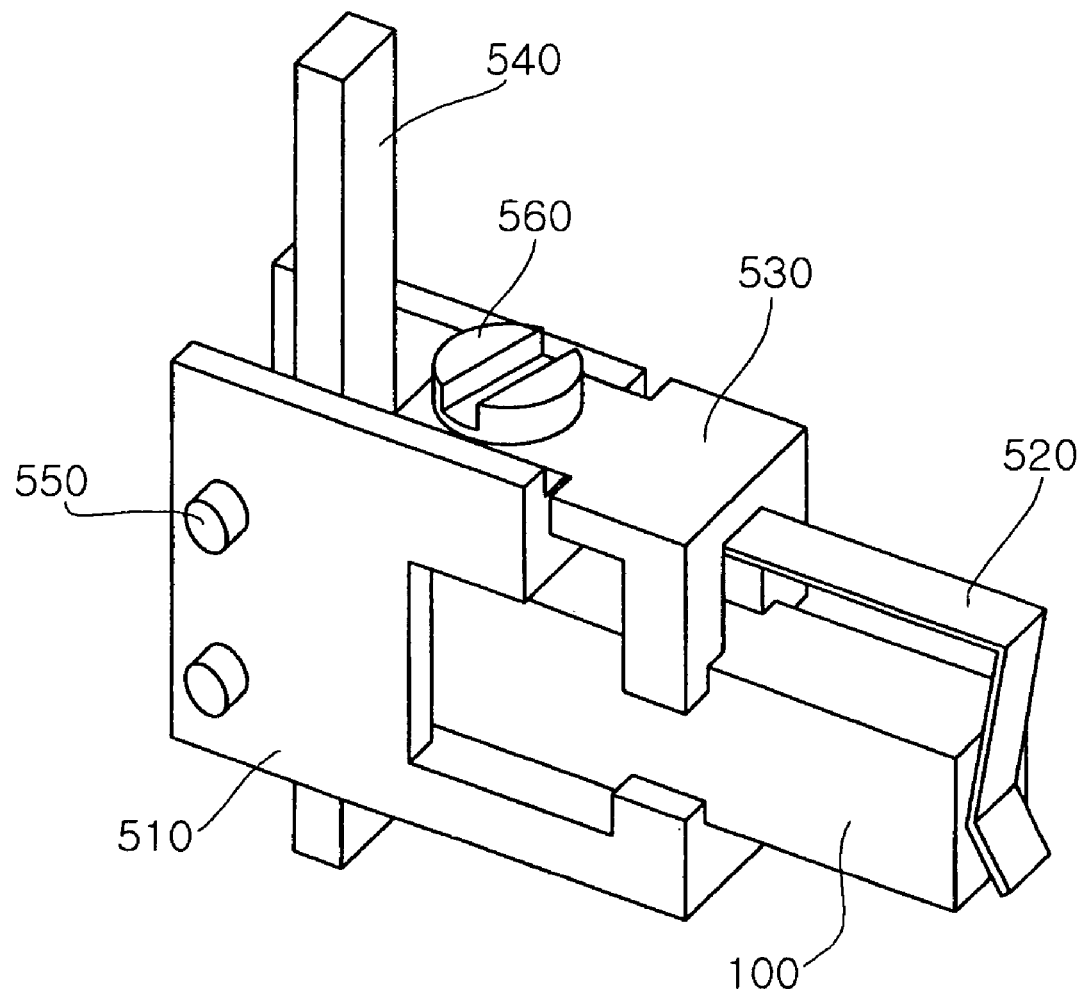
FIG. 9 is a perspective view illustrating the linear actuator according to the present invention.
Figure 10:
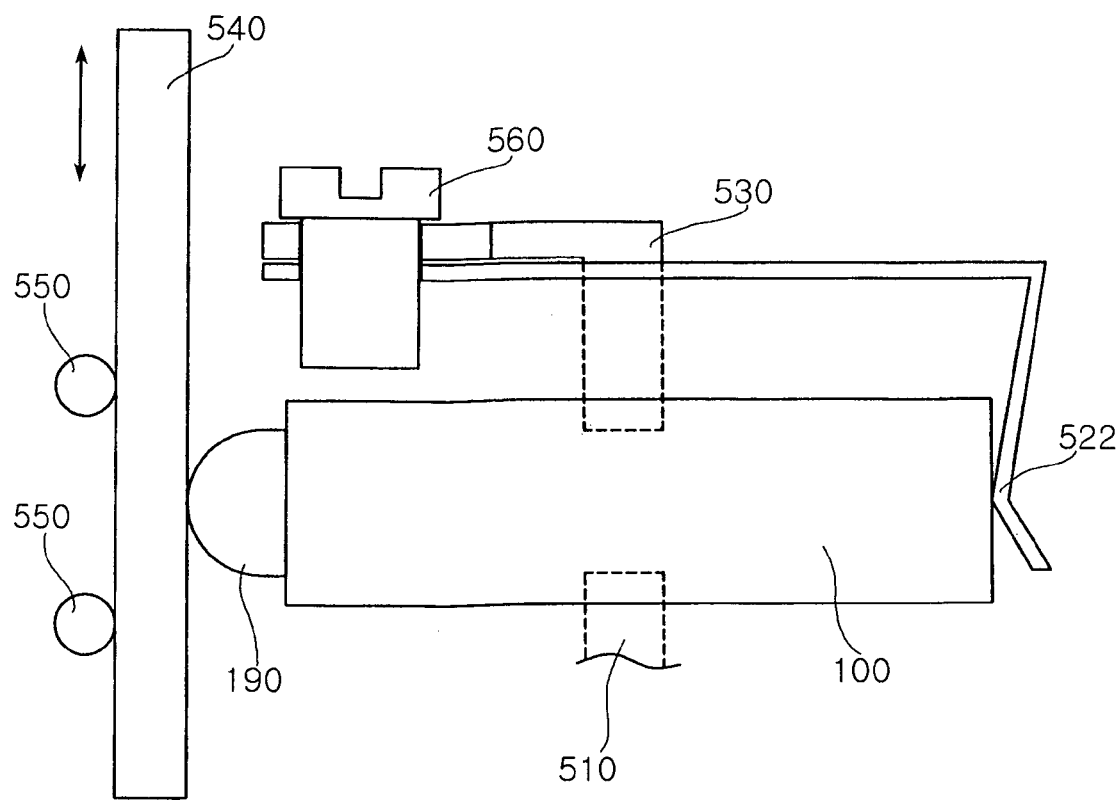
FIG. 10 is a sectional view illustrating an operation of the linear actuator according to the present invention.

In the meantime, after the piezoelectric bars 420 are separated from the piezoelectric sheet assembly 400, the side electrodes 310, 320, 330 and 340, top electrodes 210 (or 220) or the bottom electrodes 230 (or 240) can be applied to connect an outside power source as shown in FIG. 7g Now, a linear actuator according to the present invention is examined with reference to FIGS. 8 to 10.

FIG. 8 is an exploded perspective view of the linear actuator according to the present invention, FIG. 9 is a perspective view of the linear actuator according to the present invention, and FIG. 10 is a sectional view illustrating the operation of the linear actuator according to the present invention.

As shown in FIGS. 8 to 10, the linear actuator 500 according to the present invention includes the piezoelectric vibrator 100 having the aforedescribed configuration, a slider 540 linearly movable in contact with the piezoelectric vibrator 100, a frame 510 in which the piezoelectric vibrator 100 is mounted, a preload member 520 which presses the slider 540 against the piezoelectric vibrator 100, and a holder member 530 for holding the preload member 520.

The piezoelectric vibrator 100 is mounted between a seating part 512 on the frame 510 and a step 532. The piezoelectric vibrator 100 has a side with the power transmission member 190 formed thereon, in contact with the slider 540. The piezoelectric vibrator 100 is preloaded against the slider 540 with the other side thereof pressured by a pressure part 522 made of a plate spring of the preload member 520.

As an example, the slider 540 may be guided by two rollers 550 disposed rotatably in assembly holes 511 of the frame, thereby linearly moving up and down by the movement of the piezoelectric vibrator 100, but is not limited thereto and may adopt other well-known linear movement using a lead screw, etc. In the meantime, if the slider 540 is configured to be fixed, the frame 510 can be configured to linearly move.

In addition, the preload member 520 can be fixed by the holder member 530 with a screw 560 inserted through the assembly holes 531 and an opening 521 thereof, but may be fixed by other well-known schemes such as bonding, welding, pressed-fitting, hooking, etc.

According to the present invention set forth above, a stacked type of piezoelectric vibrator is easily manufactured with a structure in which an internal electrode pattern is easily connected to an external electrode using electrode terminals and jump terminals.

In addition, electrodes are formed at sides of a piezoelectric bar comprising stacked piezoelectric plates, thereby allowing miniaturization and low-power driving.

In particular, the jump terminals allow easy connection with the internal electrode pattern as well as between vibration sectors diagonally disposed from each other, simplifying the manufacturing process and saving the costs with the fewer side electrodes.

Further, a plurality of piezoelectric bars are simultaneously manufactured using piezoelectric sheets, which is followed by installing the external electrode pattern on the piezoelectric bar to complete the manufacturing of the piezoelectric vibrator, facilitating manufacturing processes and enabling mass production.

While the present invention has been shown and described in connection with the preferred embodiments, it will be apparent to those skilled in the art that modifications and variations can be made without departing from the spirit and scope of the invention as defined by the appended claims.

What is claimed is:

1. A piezoelectric vibrator comprising:
   a piezoelectric bar including a plurality of piezoelectric plates alternately stacked, the piezoelectric bar having a plurality of vibration sectors divided vertically and horizontally with respect to the direction in which the piezoelectric plates are stacked;
   an internal electrode pattern formed on upper or lower surfaces of the piezoelectric plates, the internal electrode pattern on each of the piezoelectric plates including two electrode terminals each disposed on each of surface regions of the piezoelectric plate, divided in a longitudinal direction thereof, the electrode terminal having an end extended to an outer periphery of the piezoelectric plate, and two jump terminals unconnected with the internal electrode pattern and formed respectively on the internal electrode pattern and corresponding to the two electrode terminals formed on a surface of an adjacent one of the piezoelectric plates, wherein the two jump terminals are disposed on a center of the surface of the piezoelectric plates facing each other, one of the electrode terminals being adjacent to one of the jump terminals, and the other of the electrode terminals surrounding the other jump terminal,
   an external electrode pattern formed on side surfaces of the piezoelectric plates, the external electrode pattern consisting of four side electrodes alternately connecting the electrode terminals and the corresponding jump terminals to power the vibration sectors, wherein each side electrode electrically connects the electrode terminals and the jump terminals arranged in a straight line and simultaneously powers pairs of the vibration sectors disposed diagonally from each other; and
   a power transmission member formed at a side of the piezoelectric bar to transmit the vibration generated at the vibration sectors to the outside,
   wherein an interface between the stacked piezoelectric plates is vertical to a direction of flexural motion generated from the piezoelectric vibrator.

2. The piezoelectric vibrator according to claim 1, wherein the piezoelectric bar comprises first and second piezoelectric plates alternately stacked, and
   the internal electrode pattern comprises a first pattern formed on the first piezoelectric plate and a second pattern formed on the second piezoelectric plate adjacent to the first piezoelectric plate.

3. The piezoelectric vibrator according to claim 2, wherein the first pattern comprises a first set of the electrode terminals and a first set of the jump terminals, which are disposed on the first piezoelectric plate, and
   the second pattern comprises a second set of the electrode terminals and a second set of the jump terminals, which are disposed on the second piezoelectric plate.

4. The piezoelectric vibrator according to claim 1, wherein each of the vibration sectors of the piezoelectric bar has the same number of piezoelectric plates stacked.

5. The piezoelectric vibrator according to claim 1, wherein the piezoelectric bar has an intermediate layer vertically separating the vibration sectors.

6. The piezoelectric vibrator according to claim 1, wherein the internal electrode pattern comprises an upper pattern disposed on an upper one of the vibration sectors and a lower pattern disposed on a lower one of the vibration sectors having a shape symmetrical to that of the upper pattern about a plane on which the piezoelectric plates are stacked.

7. The piezoelectric vibrator according to claim 1, wherein the piezoelectric bar comprises four of the vibration sectors, wherein alternating voltages of the same phase are applied to a pair of the vibration sectors disposed diagonally from each other to simultaneously generate a vibration of longitudinal mode and a vibration of flexural mode.

8. A linear actuator comprising:
   a piezoelectric vibrator described in claim 1; and
   a slider disposed linearly movable, in contact with a power transmission member of the piezoelectric vibrator.

9. The linear actuator according to claim 8, further comprising a preload member which presses the piezoelectric vibrator against the slider.

* * * * *